United States Patent
Shako et al.

(10) Patent No.: US 7,486,744 B2
(45) Date of Patent: Feb. 3, 2009

(54) DISTORTION COMPENSATION APPARATUS

(75) Inventors: Hideharu Shako, Kawasaki (JP);
Yasuhito Funyu, Kawasaki (JP);
Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 471 days.

(21) Appl. No.: 11/188,782

(22) Filed: Jul. 26, 2005

(65) Prior Publication Data

US 2006/0215783 A1    Sep. 28, 2006

(30) Foreign Application Priority Data

Mar. 22, 2005    (JP)    ............... 2005-082364

(51) Int. Cl.
*H04L 25/49* (2006.01)
(52) U.S. Cl. .................................... 375/296
(58) Field of Classification Search ......... 332/123–125, 332/149, 159–161; 375/285, 295–297, 160, 375/161
See application file for complete search history.

(56) References Cited

U.S. PATENT DOCUMENTS

| 5,404,378 | A  | * | 4/1995  | Kimura ................... 375/296 |
| 6,657,493 | B2 |   | 12/2003 | Ode et al. |
| 6,836,517 | B2 |   | 12/2004 | Nagatani et al. ............. 375/296 |
| 6,864,745 | B2 | * | 3/2005  | Ode et al. ................... 330/149 |
| 7,106,133 | B2 | * | 9/2006  | Hamada et al. ............. 330/149 |
| 7,215,717 | B2 | * | 5/2007  | Doi ............................ 375/297 |
| 7,242,247 | B2 | * | 7/2007  | Hirose et al. ................ 330/149 |
| 2001/0051504 | A1 |   | 12/2001 | Kubo et al. |
| 2004/0212428 | A1 | * | 10/2004 | Ode et al. .................... 330/149 |
| 2005/0101254 | A1 | * | 5/2005  | Sasaki et al. ................ 455/63.1 |
| 2005/0184803 | A1 | * | 8/2005  | Hirose et al. ................ 330/149 |

FOREIGN PATENT DOCUMENTS

| EP | 1 322 034 A1 | 6/2003 |
| EP | 1 705 801 A2 * | 9/2006 |
| JP | 2001-189685 | 2/2002 |
| JP | 2003-142959 | 5/2003 |
| WO | WO 03/103163 A1 | 12/2003 |

OTHER PUBLICATIONS

Banelli, P., "Error Sensitivity in Adaptive 1-7 Predistortion Systems," vol. 1B, GLOBECOM '99, pp. 883-888, Dec. 5, 1999.
Japanese Office Action No. 2005-082364 date Sep. 24, 2008 with English Translation.

* cited by examiner

*Primary Examiner*—Tesfaldet Bocure
(74) *Attorney, Agent, or Firm*—Hanify & King, P.C.

(57) ABSTRACT

A step size parameter $\mu$ is adaptively varied when a distortion compensation coefficient is calculated in a distortion compensation apparatus, relation between transmission signal level and step size parameter $\mu$ is considered. The distortion compensation apparatus includes a memory storing distortion compensation coefficient in a designated write address, and outputting distortion compensation coefficient being stored in a designated readout address; a predistortion section performing distortion compensation processing onto a transmission signal, using the distortion compensation coefficient being output from memory; and a distortion compensation section calculating an update value of distortion compensation coefficient, based on error component existent between transmission signal before distortion compensation processing and transmission signal after being amplified by an amplifier. Further, the distortion compensation section modifies magnitude of step size parameter determining degree of effect of error component produced on the update value, when calculating the update value of the distortion compensation coefficient.

7 Claims, 9 Drawing Sheets

High Power Output (43dB)  $\mu = 1/1024$

High Power Output (43dB)  $\mu = 1/16$

Low Power Output (27dB)  $\mu = 1/1024$

Low Power Output (27dB)  $\mu = 1/16$

DISTORTION COMPENSATION APPARATUS

BACKGROUND OF THE INVENTION

1. Field of the Invention

The present invention relates to a predistortion compensation apparatus for performing distortion compensation processing in advance to a transmission signal before amplification.

2. Description of the Related Art

In recent years, high-efficient digital transmission has been adopted in the radio communication field. When multilevel phase modulation is adopted in the radio communication, a technique for reducing adjacent channel leak power becomes important, in which nonlinear distortion is restrained by linearizing the amplification characteristic of a power amplifier on the transmission side.

Also, to improve power efficiency even in case an amplifier having a degraded linearity is used, a technique for compensating nonlinear distortion for the degraded linearity is necessary.

FIG. 1 shows an exemplary block diagram of transmission equipment in the conventional radio equipment. A transmission signal generator 1 outputs a digital serial data sequence. Also, a serial-to-parallel (S/P) converter 2 converts the digital data sequence into two series, in-phase component (I-component) signals and quadrature component (Q-component) signals, by alternately distributing the digital data sequence on a bit-by-bit basis.

A digital-to-analog (D/A) converter 3 converts the respective I-signals and Q-signals into analog baseband signals, and inputs the signals into a quadrature modulator 4. This quadrature modulator 4 performs orthogonal transformation and outputs signals by multiplying the input I-signals and Q-signals (transmission baseband signals) by a reference carrier wave 8 and a carrier wave phase-shifted therefrom by 90°, respectively, and adding the multiplied results.

A frequency converter 5 mixes the quadrature modulation signals with local oscillation signals, and converts the mixed signals into radio frequency. A transmission power amplifier 6 performs power amplification of the radio frequency signals output from frequency converter 5, and radiates the signal to the air from an antenna 7.

Here, in the mobile communication using W-CDMA, etc., transmission equipment power is substantially large, becoming as much as 10 mW to several tens of mW, and transmission power amplifier 6 has a nonlinear input/output characteristic having a distortion function f(p), as shown by the dotted line in FIG. 2. This non-linearity causes a non-linear distortion. As shown by the solid line (b) in FIG. 3, the frequency spectrum in the vicinity of a transmission frequency $f_0$ comes to have a raised sidelobe from the characteristic shown by the broken line (a). This leaks to adjacent channels and produces adjacent interference. Namely, due to the nonlinear distortion shown in FIG. 2, leak power of the transmission wave to the adjacent frequency channels becomes large, as shown in FIG. 3.

An ACPR (adjacent channel power ratio) is used to indicate the magnitude of leak power. ACPR is a ratio of leak power to adjacent channels to the power in the channel of interest, in other words, a ratio of the spectrum area in the adjacent channels sandwiched between the lines B and B' in FIG. 3 to the spectrum area between the lines A and A'. Such leak power affects other channels as noise, and degrades communication quality of the channels concerned. Therefore, a strict regulation has been established to the issue of leak power.

The leak power is substantially small in a linear region of, for example, a power amplifier (refer to a linear region I in FIG. 2), but is large in a nonlinear region II. Accordingly, to obtain a high-output transmission power amplifier, the linear region I has to be widened. However, for this purpose, it becomes necessary to provide an amplifier having a larger capacity than is actually needed, which causes disadvantage in apparatus cost and size. As a measure to solve this problem, a distortion compensation function to compensate for transmission power distortion is added to radio equipment.

FIG. 4 shows the block diagram of transmission equipment having a digital nonlinear distortion compensation function by use of a DSP (digital signal processor). A digital data group (transmission signals) transmitted from transmission signal generator 1 is converted into two series, I-signals and Q-signals, in S/P converter 2, and then the two series of signals are input to a distortion compensator 9.

As shown in the lower part of FIG. 4 in enlargement, distortion compensator 9 includes a distortion compensation coefficient storage 90 for storing a distortion compensation coefficient h(pi) corresponding to the power level pi (i=0-1023) of a transmission signal x(t); a predistortion portion 91 for performing a distortion compensation process (predistortion) onto the transmission signal, using the distortion compensation coefficient h(pi) corresponding to the transmission signal power level; and a distortion compensation coefficient calculator 92 for comparing the transmission signal x(t) with a demodulation signal (a feedback signal) y(t) demodulated in the quadrature detector which will be described later, and calculates and updates the distortion compensation coefficient h(pi) so that the difference between the transmission signal and the demodulation signal becomes zero.

The signal to which distortion process is performed in distortion compensator 9 is input into D/A converter 3. D/A converter 3 converts the input I-signal and Q-signal into analog baseband signals, and inputs the converted signals into quadrature modulator 4. Quadrature modulator 4 performs quadrature modulation by multiplying the input I-signal and Q-signal by a reference carrier wave 8 and a carrier wave being phase-shifted from carrier wave 8 by 90°. Quadrature modulator 4 then adds and outputs the multiplied result.

A frequency converter 5 mixes the quadrature modulation signal with a local oscillation signal, and performs frequency conversion. A transmission power amplifier 6 performs power amplification of the radio frequency signal output from frequency converter 5, and radiates the signal to the air by an antenna 7.

A portion of the transmission signal is input to a frequency converter 11 via a directional coupler 10, and input into a quadrature detector 12 after being converted by the above frequency converter 11. Quadrature detector 12 performs quadrature detection by multiplying the input signal by a reference carrier wave, and by a signal which is phase shifted by 90° from the reference signal, respectively. Thus, the baseband I-signal and Q-signal on the transmission side are reproduced, which are then input into an analog-to-digital (A/D) converter 13.

A/D converter 13 converts the input I-signal and Q-signal into digital signals, and inputs into distortion compensator 9. Through the adaptive signal processing, using an LMS (least-mean-square) algorithm, in distortion compensation coefficient calculator 92 of distortion compensator 9, the pre-compensated transmission signal is compared with the feedback signal being demodulated in quadrature detector 12. Then distortion compensator 9 calculates the distortion compensation coefficient h(p1) so as to make the above difference zero. Then, distortion compensator 9 updates the above-obtained coefficient which has been stored in distortion compensation coefficient storage 90. Through the repetition of calculations above, nonlinear distortion in transmission power amplifier 6 is restrained, and adjacent channel leak power is reduced.

By way of example, in the PCT International Publication WO 2003/103163, such a configuration as shown in FIG. 5, in which distortion compensation is performed using the adaptive LMS algorithm, is described as an embodiment of distortion compensator 9 shown in FIG. 4.

In FIG. 5, a multiplier 15*a* corresponds to a predistortion section 91 shown in FIG. 4, in which a transmission signal x(t) is multiplied by a distortion compensation coefficient $h_{n-1}(p)$. Also, a distortion device 15*b* having a distortion function f(p) corresponds to a transmission power amplifier 6 shown in FIG. 4.

Further, as to the portion in FIG. 4 including a frequency converter 11, a quadrature detector 12 and an A/D converter 13, in which the output signal being output from transmission power amplifier 15*b* is feedbacked, a feedback system 15*c* is shown in FIG. 5.

Moreover, in FIG. 5, a look-up table (LUT) 15*e* constitutes a distortion compensation coefficient storage 90 shown in FIG. 4. A distortion compensation coefficient calculation section 16 constitutes a distortion compensation coefficient calculation section 92 shown in FIG. 4, which generates an update value of the distortion compensation coefficient stored in look-up table 15*e*.

In the distortion compensation apparatus having the configuration shown in FIG. 5, look-up table 15*e* has a distortion compensation coefficient for canceling the distortion produced in transmission power amplifier 6, namely, distortion device 15*b*, in a two-dimensional address location corresponding to each discrete power value of the transmission signal x(t).

When the transmission signal x(t) is input, an address generation circuit 15*d* calculates the power p ($=x^2(t)$) of the transmission signal x(t), and generates an address of one dimensional direction, for example the X-axis direction, which uniquely corresponds to the above-calculated power p ($=x^2(t)$) of the transmission signal x(t). At the same time, address generation circuit 15*d* obtains a difference ΔP of the power P1 ($=x^2(t-1)$) of the transmission signal x(t-1) of the previous time point (t-1) having been stored in address generation circuit 15*d*, and generates an address of the other dimensional direction, for example, the Y-axis direction, which uniquely corresponds to the above difference ΔP.

Thus, from address generation circuit 15*d*, a store location in look-up table 15*e*, which is specified by the address P in the X-axis direction and the address ΔP in the Y-axis direction, is read out. The readout address is output as address designation information (AR).

Then, a distortion compensation coefficient $h_{n-1}(p)$ stored in the above readout address is read out from look-up table 15*e*, so as to be used in the distortion compensation processing performed by multiplier 15*a*.

Meanwhile, an update value for updating the distortion compensation coefficient having been stored in look-up table 15*e* is calculated in a distortion compensation coefficient calculation section 16. Namely, distortion compensation coefficient calculation section 16 is constituted of a conjugate complex calculation section 16 and multipliers 15*h*-15*j*. A subtractor 15*g* outputs a difference e(t) between the transmission signal x(t) and the feedback demodulation signal y(t). Multiplier 15*i* multiplies the distortion compensation coefficient $h_{n-1}(p)$ by y*(t), so as to obtain an output u*(t) ($=_{n-1}(p)$ y*(t)). Multiplier 15*h* multiplies the difference e(t) being output from subtractor 15*g* by u*(t). Multiplier 15*j* multiplies the output of multiplier 15*h* by a step size parameter μ.

Next, an adder 15*k* adds the distortion compensation coefficient $h_{n-1}(p)$ to the output μe(t)u*(t) being output from multiplier 15*j*, and obtains an update value of look-up table 15*e*. This update value is to be stored in a write address (AW), consisting of the X-axis direction address and the Y-axis direction address, being specified by address generation circuit 15*d* as the address corresponding to the transmission signal power p ($=x^2(t)$).

Here, the aforementioned write address (AW) is the same address as the readout address (AR). However, because of a calculation time, etc. needed to obtain the update value, the readout address is used as the write address after the readout address is delayed in a delay section 15*m*.

Delay portions 15*m*, 15*n*, 15*p* add to the transmission signal x(t), the delay time D, which is the period from the input of the transmission signal x(t) to the feed back decoded signal y(t) input to the subtractor 15*g*.

The delay time D being set by the delay portions 15*m*, 15*n*, 15*p* is determined so as to satisfy D=D0+D1, where D0 is the delay time in transmission power amplifier 15*b*, and D1 is the delay time in feedback system 15*c*.

Using the above configuration, the following calculations are performed.

$h_n(p)=h_{n-1}(p)+\mu e(t)u^*(t)$ $e(t)=x(t)-y(t)$ $y(t)=h_{n-1}(p)\times(t)f(p)$ $u^*(t)=x(t)f(p)=h_{n-1}(p)y^*(t)$ $p=|x(t)|^2$ Here, x, y, f, h, u, e are complex numbers, and * denotes a conjugate complex number.

Through the above calculation processing, the distortion compensation coefficient h(p) is updated so as to minimize the differential signal e(t) between the transmission signal x(t) and the feedbacked demodulation signal y(t). Finally, the value converges to an optimal distortion compensation coefficient, so that the distortion of the transmission power amplifier is compensated.

Now, in the above calculation, the step size parameter μ determines a degree of effect of an error component e(t) between the transmission signal x(t), i.e. the reference signal, and the feedback demodulation signal y(t), i.e. the feedback signal, on the update value of the distortion compensation coefficient. In the conventional system, the value of the step size parameter μ is set to a fixed value.

In the configuration of the distortion compensation apparatus shown in FIG. 5, the inventor of the present invention has observed the output of the distortion compensation apparatus by inputting the outputs of transmission power amplifier 15*b*, the distortion device, into a spectrum analyzer with sweep frequencies. FIGS. 6A through 7B are the results obtained at those times. In the examples shown in FIGS. 6A through 7B, the observations have been made with different transmission signal levels in four frequency bands (channels).

FIGS. 6A, 6B represent the output spectrum waveforms of the spectrum analyzer when the transmission signal level is large (43 dB). FIG. 6A shows the spectrum waveform when the step size parameter μ is set to 1/1024, while FIG. 6B shows the spectrum waveform when the step size parameter μ is set to 1/16.

Also, FIGS. 7A, 7B represent the output spectrum waveforms of the spectrum analyzer when the transmission signal level is small (27 dB). FIG. 7A shows the spectrum waveform when the step size parameter μ is set to 1/1024, while FIG. 7B shows the spectrum waveform when the step size parameter μ is set to 1/16.

From these FIGS. 6A through 7B, it has been found out that the relation between the transmission signal level and the step size parameter μ produces an effect on the distortion compensation coefficient. In FIGS. 6A, 6B, if the step size parameter μ is set larger when the transmission signal level is large (refer to FIG. 6B), external disturbance (phase rotation, quantization error in an A/D converter, etc.) affects greater, resulting in a larger number of rise pulses being produced. By this, the compensation coefficient tends to diverge at the time of calculating the error.

On the contrary, if the step size parameter μ is set smaller when the transmission signal level is small, a minute error having been detected is canceled, which produces a problem of preventing proper update of the compensation coefficient (refer to FIG. 7A).

SUMMARY OF THE INVENTION

Accordingly, on the basis of the above results, it is an object of the present invention to provide a distortion compensation apparatus in which further improvement of the distortion compensation characteristic is intended.

As a first aspect of the distortion compensation apparatus according to the present invention to attain the aforementioned object, the distortion compensation apparatus includes: a memory storing a distortion compensation coefficient in a designated write address, and outputting a distortion compensation coefficient being stored in a designated readout address; a predistortion section performing distortion compensation processing onto a transmission signal, using the distortion compensation coefficient being output from the memory; and a distortion compensation section calculating an update value of the distortion compensation coefficient, based on the error component existent between the transmission signal before the distortion compensation processing and the transmission signal after being amplified by an amplifier. The distortion compensation section further includes a function of controlling to modify a degree of effect of the error component produced on the update value, when calculating the update value of the distortion compensation coefficient.

As a second aspect of the distortion compensation apparatus according to the present invention to attain the aforementioned object, in the above first aspect, the modification of the degree of effect is realized by modifying the magnitude of the parameter to be multiplied by the error component. The distortion compensation section includes: a memory storing a parameter in advance, corresponding to the integral value of the transmission signal before the distortion compensation processing or the transmission signal after being amplified by the amplifier; an integrator generating an integral value of the transmission signal before the distortion compensation processing or the transmission signal after being amplified by the amplifier; and a control means for reading out the parameter corresponding to the output of the integrator from the memory. The parameter corresponding to the integral value is being set to a smaller value as the integral value becomes larger.

As a third aspect of the distortion compensation apparatus according to the present invention to attain the aforementioned object, in the above second aspect, when the integral value is not larger than a predetermined value, the control means sets the parameter value to zero.

As a fourth aspect of the distortion compensation apparatus according to the present invention to attain the aforementioned object, in the first aspect, the modification of the degree of effect is realized by modifying the magnitude of the parameter to be multiplied by the error component. The distortion compensation apparatus includes: a fast Fourier transform circuit performing fast Fourier transform of the transmission signal after being amplified by the amplifier; and a control means setting an optimal parameter value based on the output of the fast Fourier transform circuit. When the magnitude of the parameter is expressed by $\frac{1}{2}^n$, the control means varies the n value by the step of ±1 in the direction of decreasing the power amount of the noise floor which is produced in the output of the fast Fourier transform circuit after the distortion compensation coefficient is updated.

As a fifth aspect of the distortion compensation apparatus according to the present invention to attain the aforementioned object, in the fourth aspect, when the power amount of the noise floor is not varied, the control means selects a smaller value out of the parameter values.

Further scopes and features of the present invention will become more apparent by the following description of the embodiments with the accompanied drawings.

DETAILED DESCRIPTION OF THE INVENTION

The preferred embodiment of the present invention is described hereinafter referring to the charts and drawings. However, it is noted that the embodiments described are intended for better understanding of the invention, and therefore the scope of the present invention is not limited to the embodiments described below.

First Embodiment

Figure 5:
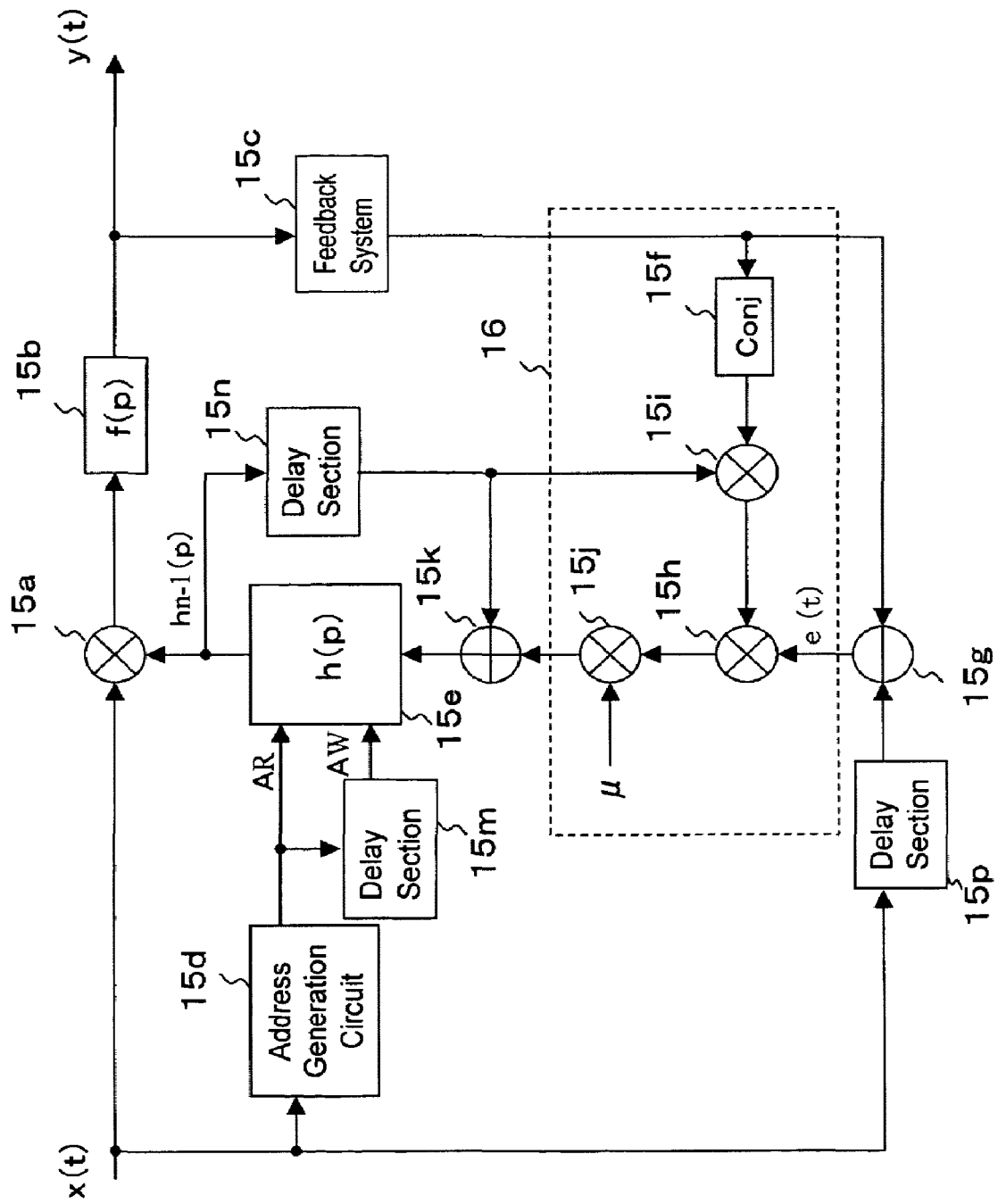
FIG. 5 shows an exemplary configuration of the embodiment of a distortion compensator 9 shown in FIG. 4.
Figure 8:
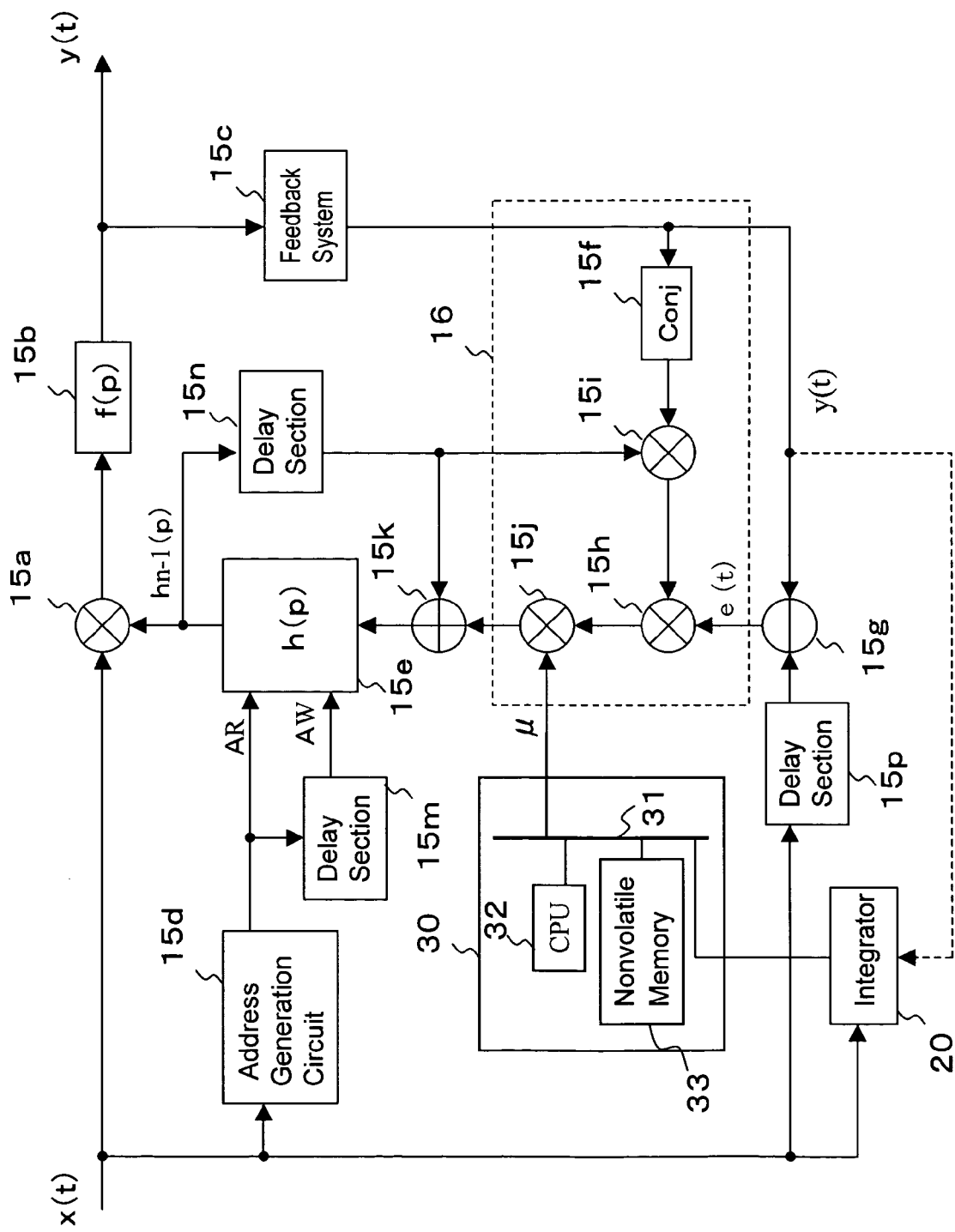
FIG. 8 shows a configuration block diagram according to a first embodiment of the distortion compensation apparatus to which the present invention is applied.

FIG. 8 is an exemplary configuration block diagram according to a first embodiment of a distortion compensation apparatus to which the present invention is applied. The parts having the like function as in the conventional configuration shown in FIG. 5 are referred to by the like reference numerals. Accordingly, further description of the like parts as shown in FIG. 5 is omitted. In the following, the above may also be applied to other embodiments.

In FIG. 8, as a feature, a control block 30 is provided for adaptively and variably setting (with a function of controlling to modify) a step size parameter μ (a parameter for varying a degree of effect of the error component produced on the update value).

Control block 30 includes a CPU 32, as a control means, and a nonvolatile memory 33 which are connected to a bus 31. Further, a distortion compensation coefficient generation circuit 16 works similarly to the circuit shown in FIG. 5. In the configuration of the exemplary embodiment shown in FIG. 8, a step size parameter μ, which is multiplied by the output of multiplier 15h in multiplier 15j, is supplied from control block 30.

The step size parameter μ supplied from control block 30 is output from CPU 32, after referring to a table stored in nonvolatile memory 33, and selecting a value corresponding to the output of an integrator 20.

Namely, integrator 20 integrates the transmission signal x(t), namely the reference signal, or the feedback signal y(t), and outputs as an integral value for each predetermined period (each calculation time of the distortion compensation coefficient). Meanwhile, in nonvolatile memory 33, which is included in control block 30 and connected to bus 31, step size parameter values μ corresponding to the integrated values obtained in integrator 20 are stored in advance and preserved.

Accordingly, CPU 32 reads the output of integrator 20, reads out a step size parameter μ having a magnitude corresponding to the above output from the table retained in nonvolatile memory 33, so as to input to the multiplier 15j.

Figure 6A:
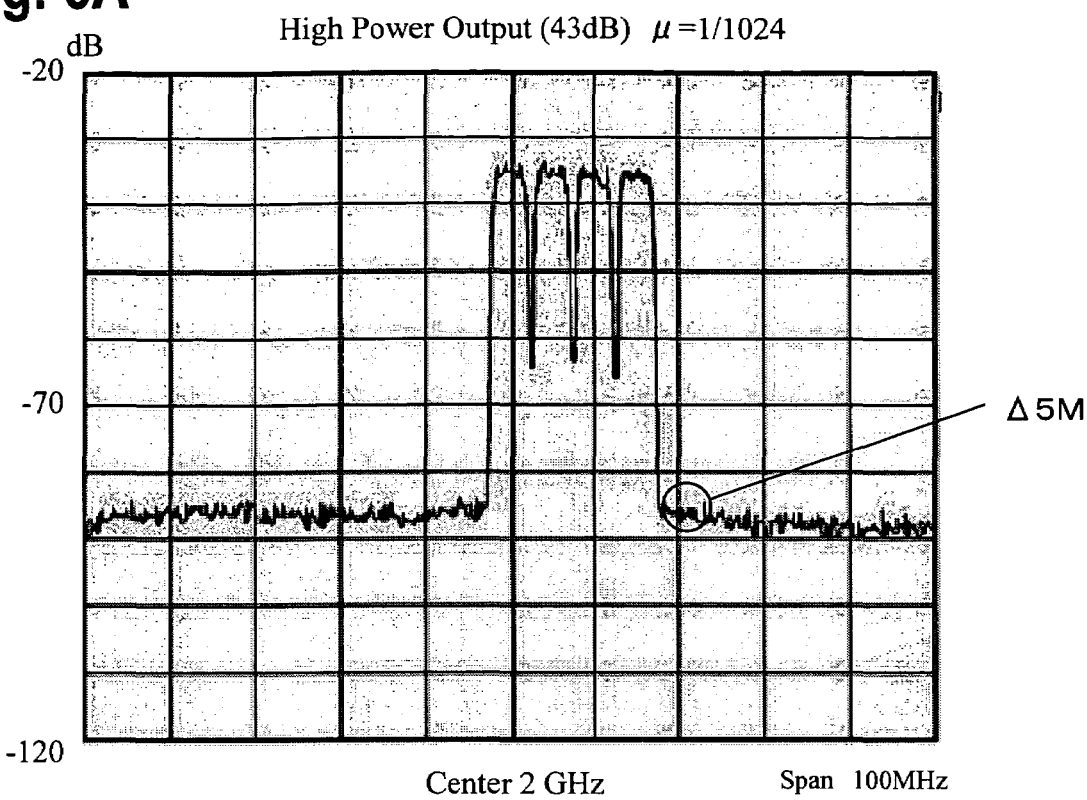
FIGS. 6A & 6B show an output waveform of a spectrum analyzer when the transmission signal level is large (43 dB).
Figure 6B:
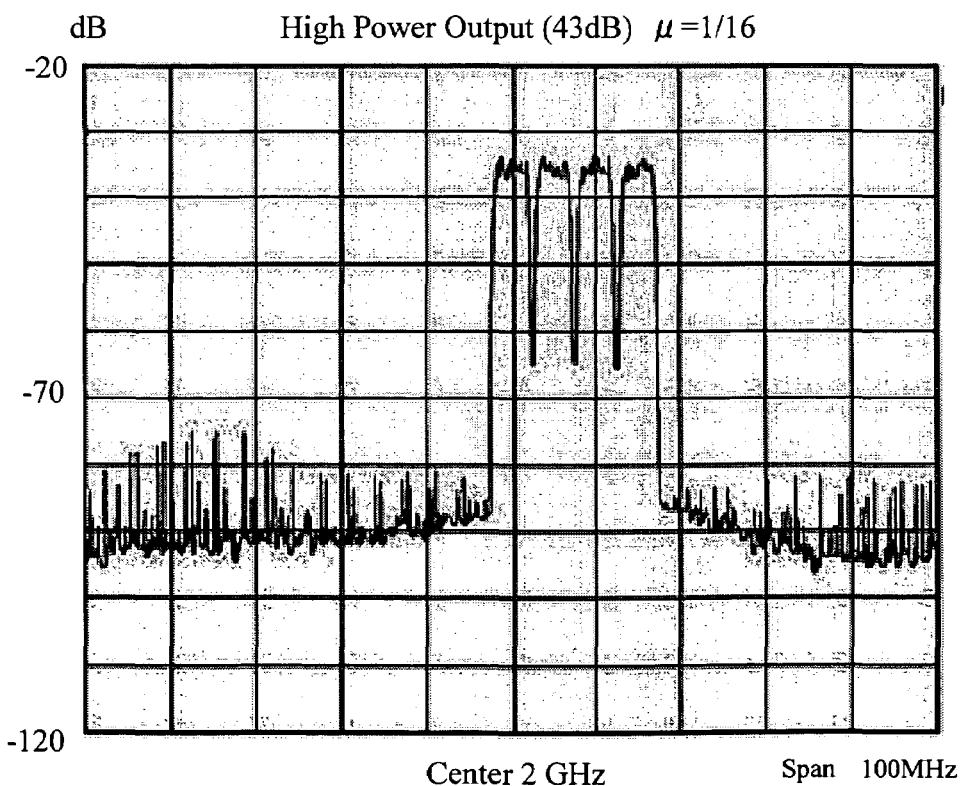
Figure 7A:
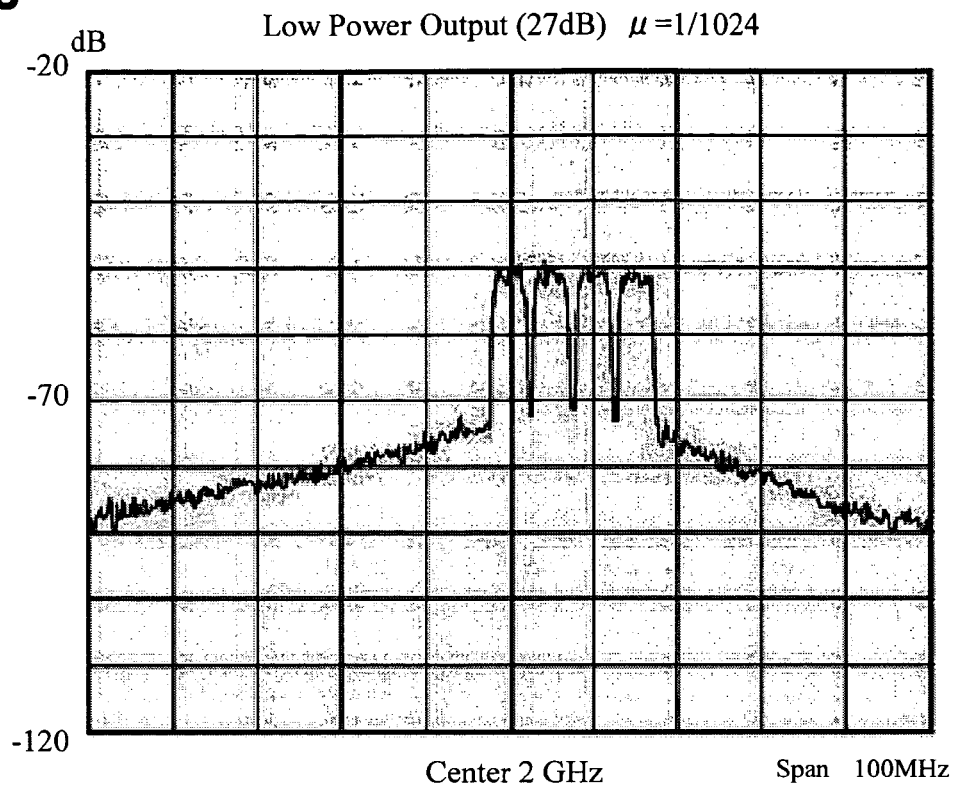
FIGS. 7A & 7B show an output waveform of a spectrum analyzer when the transmission signal level is small (27 dB).
Figure 7B:
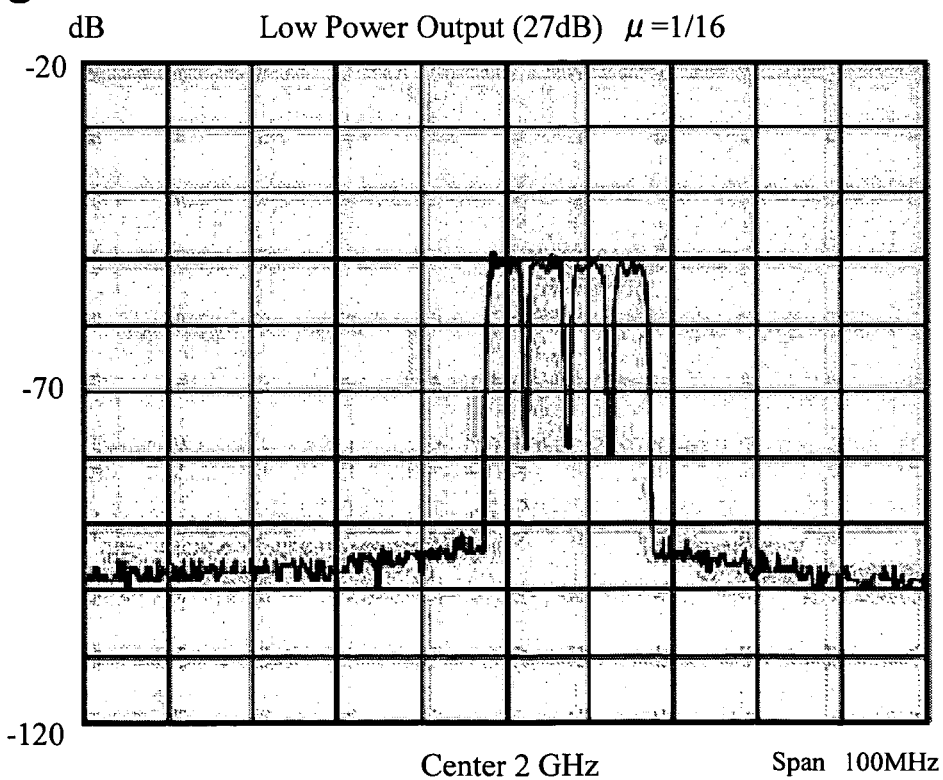

As to the magnitudes of the step size parameters μ retained in the table stored in nonvolatile memory 33, the larger the level of either the feedback signal y(t) or the reference signal x(t) is, the smaller the magnitude is set. With this, it becomes possible to maintain the relation shown in FIG. 6A.

Figure 1:
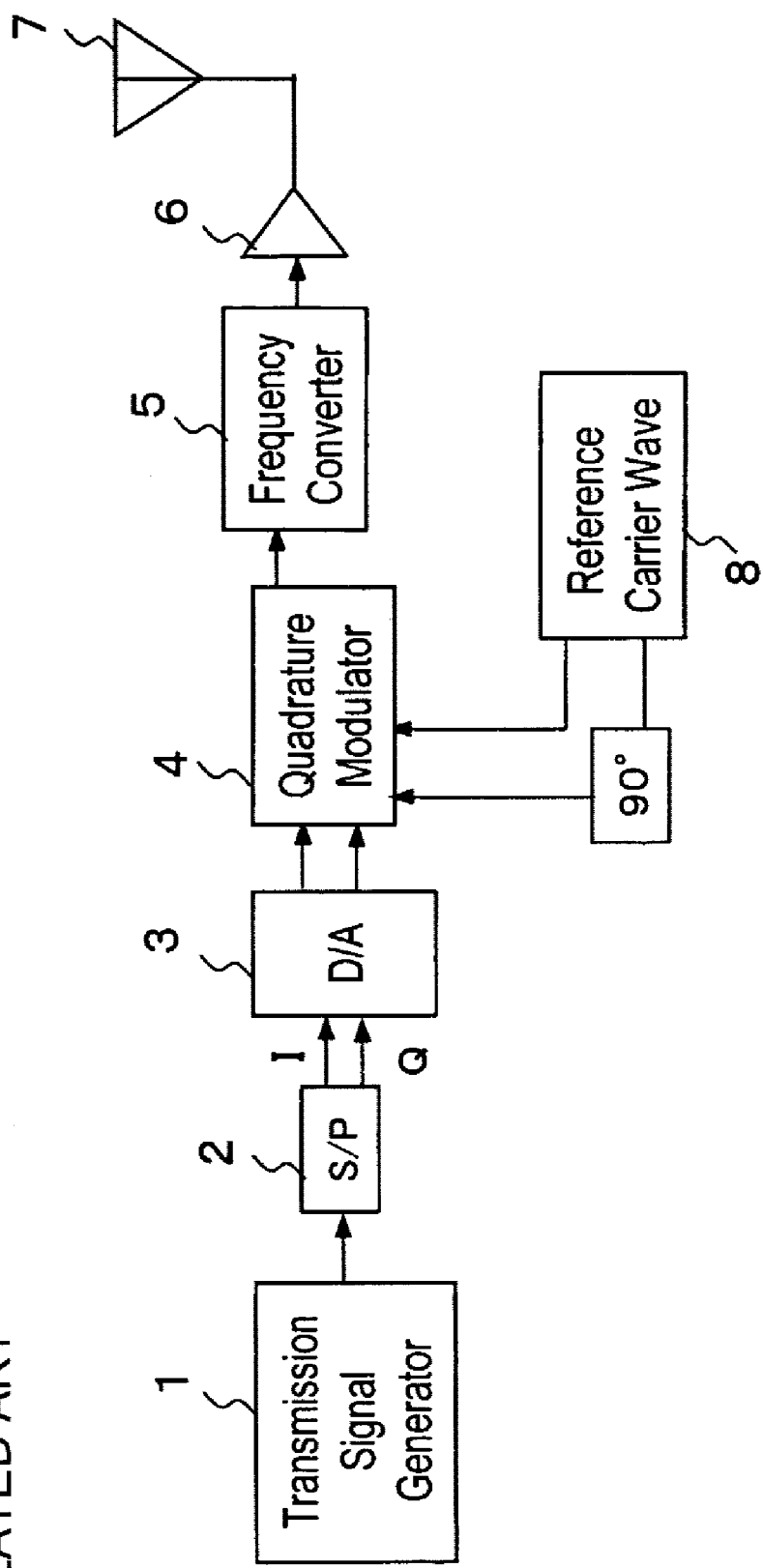
FIG. 1 shows a block diagram of exemplary transmission equipment in the conventional radio equipment.
Figure 2:
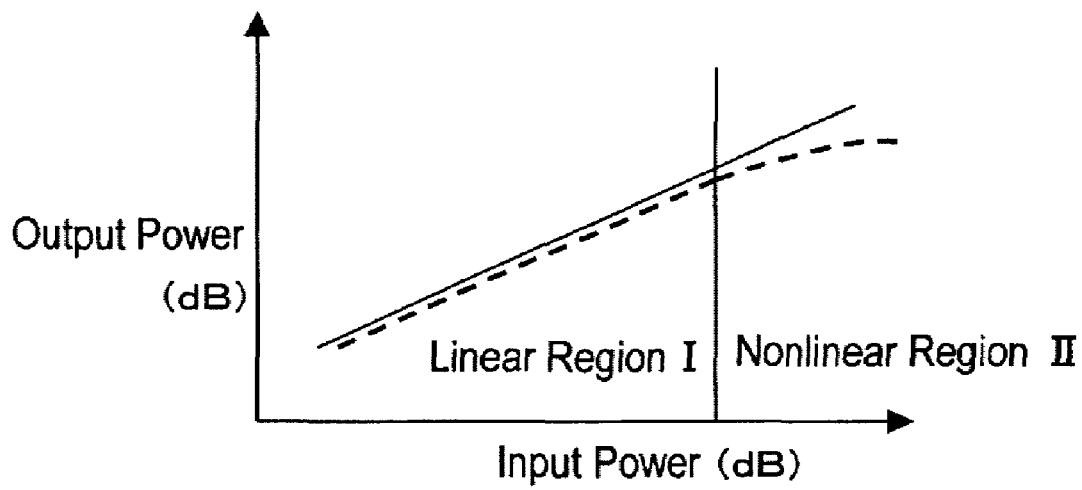
FIG. 2 shows a diagram illustrating the input/output characteristic (having a distortion function f(p)) of a transmission power amplifier.
Figure 3:
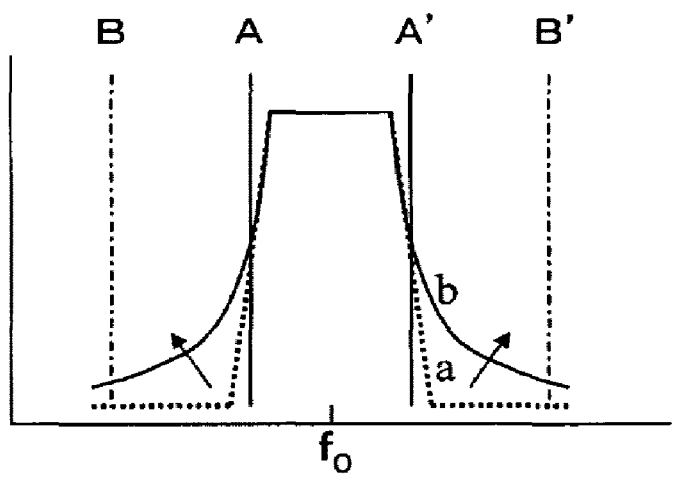
FIG. 3 shows a diagram illustrating nonlinear distortions produced by the nonlinear characteristic.
Figure 4:
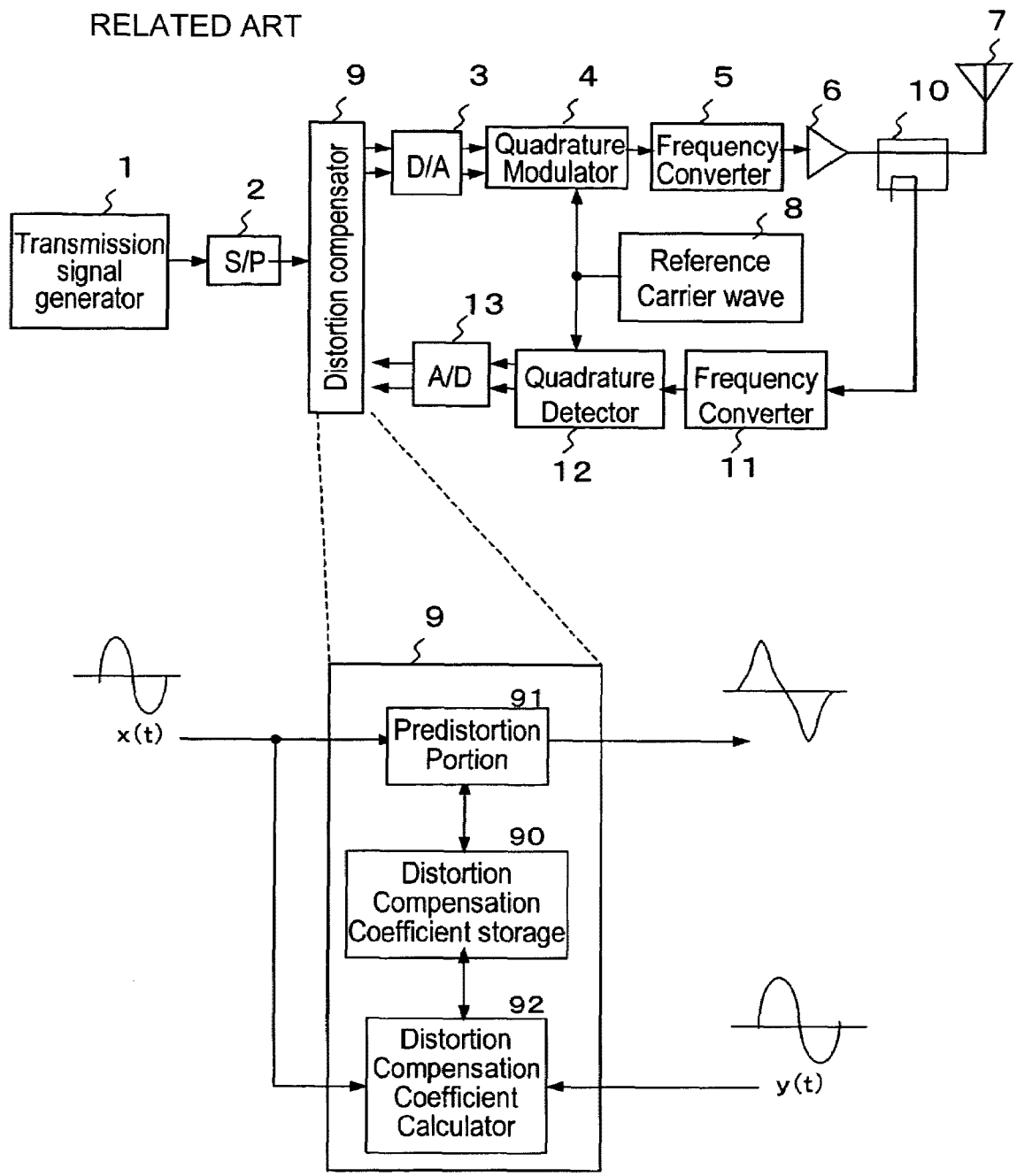
FIG. 4 shows a block diagram of transmission equipment having a digital nonlinear distortion compensation function by use of a DSP (digital signal processor).

On the contrary, if the output of integrator 20 becomes too small, namely, if the value of the feedback signal y(t) or the reference signal x(t) is small, a distortion compensation coefficient error becomes large because of the quantization error in the A/D converter (refer to A/D converter 13 shown in FIG. 4), etc., and as a result, it becomes not possible to correctly update the distortion compensation coefficient.

Therefore, in this case, the step size parameter μ is set to "0". By this, the output of multiplier 15j becomes "0", and the output of adder 15k remains the distortion compensation coefficient $h_{n-1}(p)$ having previously been read out unchanged. Thus, the distortion compensation coefficient stored in look-up table 15e is not updated. This includes the same meaning as that no update is necessary, because the distortion produced is small when the level of the transmission signal x(t) is small.

Second Embodiment

Figure 9:
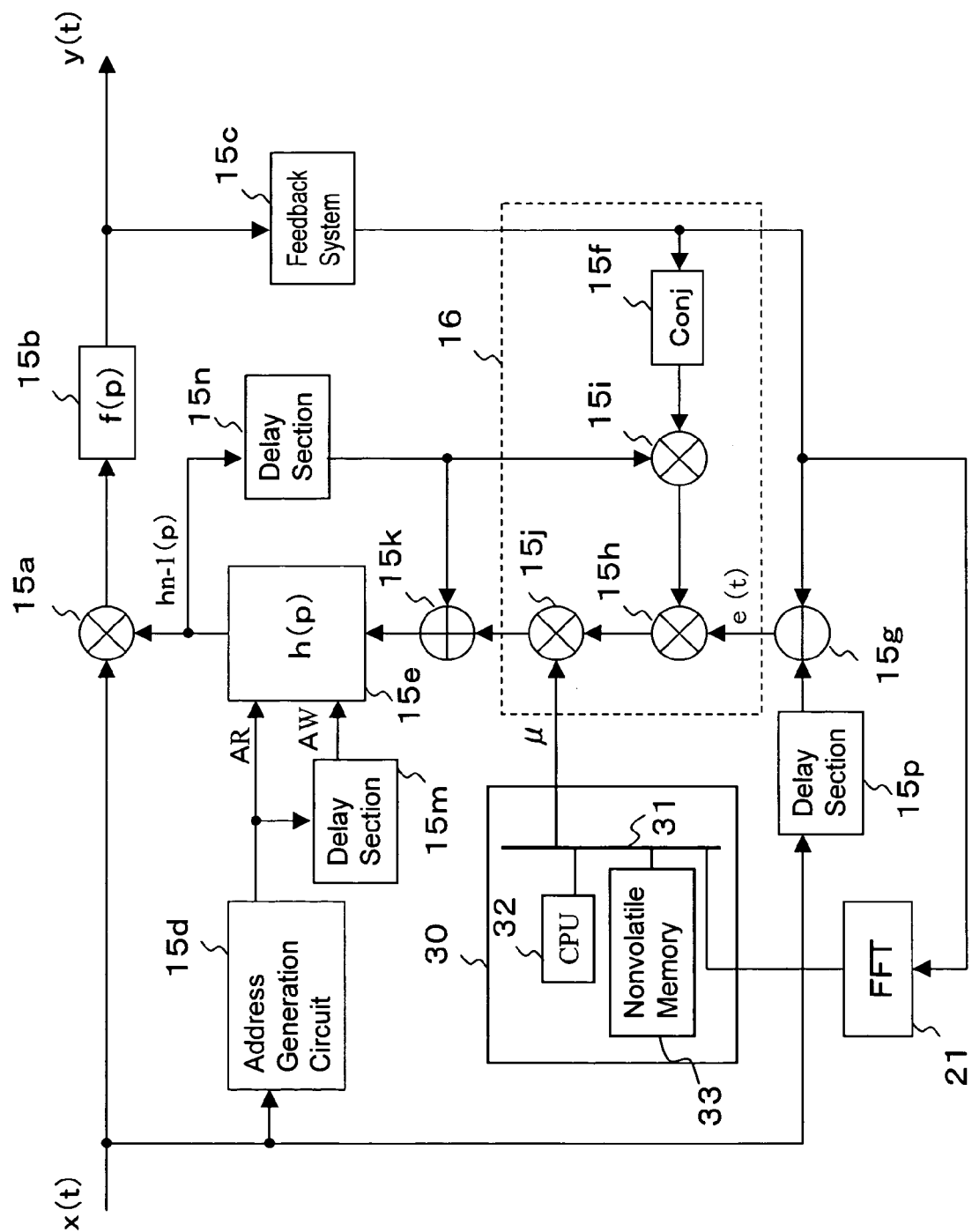
FIG. 9 shows a configuration block diagram according to a second embodiment of the distortion compensation apparatus to which the present invention is applied.

FIG. 9 is a configuration block diagram according to a second embodiment of the distortion compensation apparatus to which the present invention is applied. In contrast to the first embodiment shown in FIG. 8, a FFT (fast Fourier transform) circuit 21 is provided, in place of integrator 20.

In the processing of the present embodiment, a method of determining an optimal value μ by varying the values of the step size parameter μ is applied.

Namely, when the value of the step size parameter μ is expressed by $½^n$, CPU 32 varies the value of "n" periodically by +1 or −1. At the time of each variation, the power amount of a noise floor (for example, the range Δ5M enclosed by a circle shown in FIG. 6A) of the output of FFT circuit 21.

Then, CPU 32 selects the direction in which the above power amount is reduced, that is, the variation direction of the value "n" to either +1 or −1. Further, when CPU 32 detects a state that the above-mentioned power amount of the noise floor does not vary virtually while varying the value "n", in order to avoid divergence of the update coefficient, CPU 32 selects the step size parameter μ having a smaller value (since the step size parameter value μ is expressed by $½^n$, the value after being varied is selected when varying the value "n" to +1 direction, while the value μ before being varied is selected when varying the value "n" to −1 direction).

Third Embodiment

Figure 10:
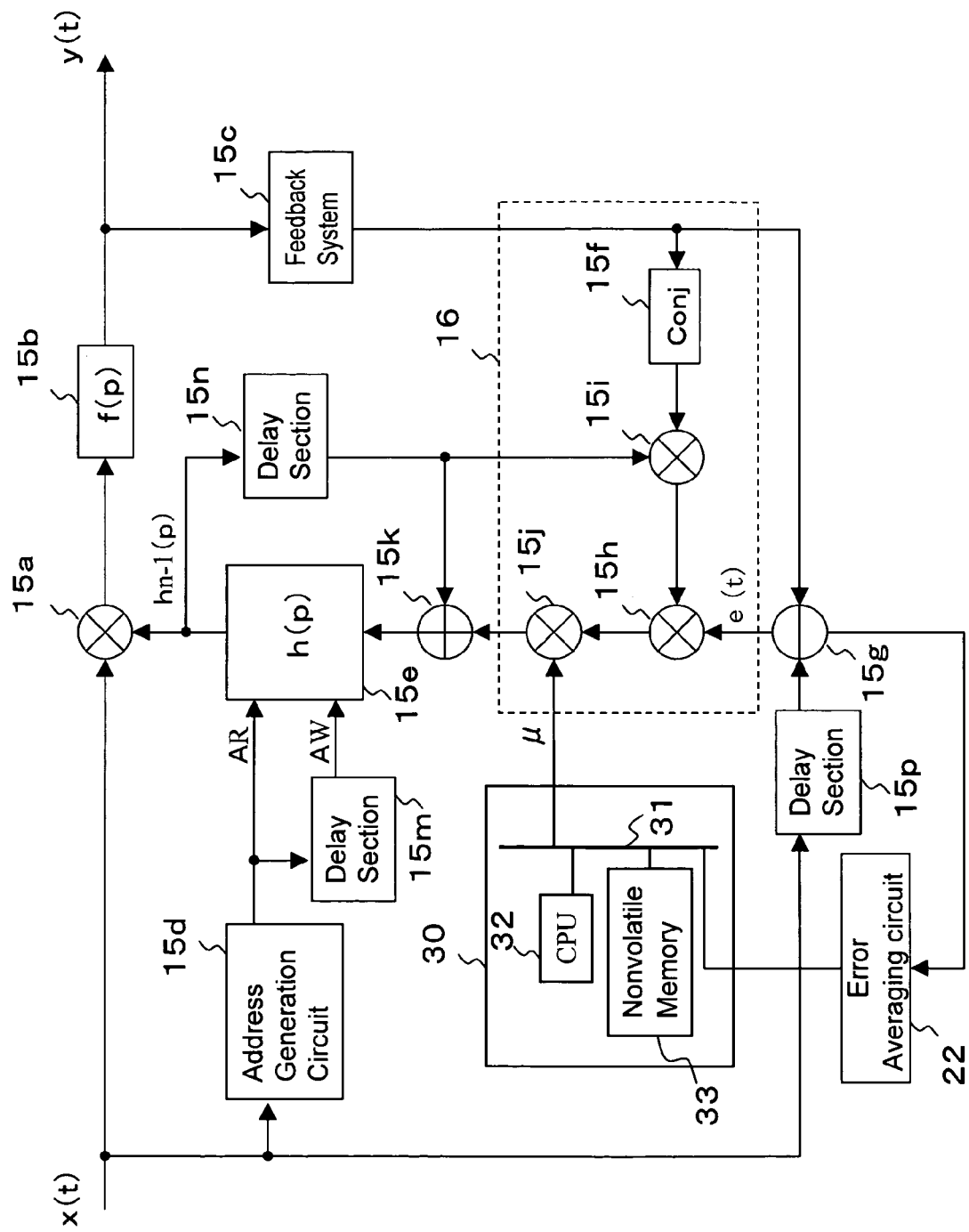
FIG. 10 shows a configuration block diagram according to a third embodiment of the distortion compensation apparatus to which the present invention is applied.

FIG. 10 is a configuration block diagram according to a third embodiment of the distortion compensation apparatus to which the present invention is applied. The like parts as in the other embodiments are referred to by the like reference numerals.

In FIG. 10, as a feature, there is provided an error averaging circuit 22, to which an error signal e(t), namely the difference between the transmission signal x(t), i.e. the reference signal obtained from subtractor 15g, and the feedback signal y(t), is input.

Error averaging circuit 22 calculates a mean amplitude value of the error signal, when the error signal obtained from subtractor 15g is input.

Here, the error signal may be considered equivalent to noise. In general, the larger the transmission signal is, the larger the noise level becomes. Therefore, considering the relation between the transmission signal level and the step size parameter μ having been described in FIGS. 6A through 7B, a mean noise level, namely the mean amplitude value of the error signal is calculated. Then, an inverse number corresponding to the mean amplitude value of the error signal is used as the step size parameter μ.

By this, the smaller the mean amplitude value is, the larger value the step size parameter becomes, or the larger the mean amplitude value is, the smaller value the step size parameter becomes. Thus, it becomes possible to avoid undesirable events such that the distortion compensation coefficient is not virtually updated because of the small amplitude of the error signal, or the distortion compensation coefficient diverges because of the large amplitude of the error signal.

For the above purpose, in nonvolatile memory 33 provided in control block 30, inverse numbers of the values corresponding to the mean amplitude values of the error signal are prepared in advance in the form of table, as step size parameters μ. CPU 32 reads the mean amplitude value output from error averaging circuit 22, reads out a step size parameter μ corresponding to the mean amplitude value output from the table retained in nonvolatile memory 33, and inputs the read-out step size parameter μ into multiplier 15j.

With the method described in the above embodiment, it becomes possible to generate a distortion compensation coefficient to be updated, using the mean amplitude value of the error signal, namely the mean noise level, as a reference. Accordingly, it is possible to avoid divergence of the distortion compensation coefficient, and to prevent a minute error component from being regarded as "0".

In each of the foregoing first through third embodiments, in general, at the time of the start of transmission, or the occurrence of a large fluctuation in the transmission output, the optimal value of the distortion compensation coefficient in the look-up table varies to a great extent. To cope with such cases, CPU 32 detects the start of transmission, or occurrence of a large fluctuation during the transmission, and sets the step size parameter μ to a large value for several hundred milliseconds from the time of the above detection.

By this operation, the update speed becomes fast, and the distortion compensation coefficient in the look-up table can be optimized at high speed.

Then, after a lapse of several hundred milliseconds, since updating of the distortion compensation coefficient in lookup table 15e is almost completed, the step size parameter μ is set to a smaller value. With this, divergence of the distortion compensation coefficient can be suppressed.

As having been described, in the aforementioned embodiments, with the provision of the means for varying and controlling the step size parameter value, it becomes possible to control a degree of effect of the error signal on the update value depending on the situations. For example, when the transmission signal level (the transmission signal level after being amplified) is high, or the error signal level is high, divergence of the distortion compensation coefficient can be suppressed by decreasing the step size parameter value. On the other hand, when the transmission signal level (the transmission signal level after being amplified) is low, or the error signal level is low, the distortion compensation coefficient can be updated effectively by increasing the step size parameter value.

According to the present invention, divergence of the distortion compensation coefficient can be avoided, and the distortion compensation characteristic can be improved. As a result, a highly reliable distortion compensation apparatus can be provided.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A distortion compensation apparatus comprising:
   a memory storing a distortion compensation coefficient in a designated write address, and outputting a distortion compensation coefficient being stored in a designated readout address;
   a predistortion section performing distortion compensation processing onto a transmission signal, using the distortion compensation coefficient being output from said memory; and
   a distortion compensation section calculating an update value of the distortion compensation coefficient, based on the error component existent between the transmission signal before said distortion compensation processing and the transmission signal after being amplified by an amplifier,
   wherein said distortion compensation section further comprises a function of controlling to modify a degree of effect of the error component produced on the update value, when calculating the update value of the distortion compensation coefficient
   wherein the modification of the degree of effect is realized by modifying the magnitude of the parameter to be multiplied by the error component, and
   wherein the distortion compensation section comprises:
   a memory storing a parameter in advance, corresponding to the integral value of the transmission signal before the distortion compensation processing or the transmission signal after being amplified by the amplifier;
   an integrator generating an integral value of the transmission signal before the distortion compensation processing or the transmission signal after being amplified by the amplifier; and
   a control means for reading out the parameter corresponding to the output of the integrator from the memory,
   wherein the parameter corresponding to the integral value is being set to a smaller value as the integral value becomes larger.

2. The distortion compensation apparatus according to claim 1,
   wherein, when the integral value is not larger than a predetermined value, the control means sets the parameter value to zero.

3. A distortion compensation apparatus comprising:
   a memory storing a distortion compensation coefficient in a designated write address, and outputting a distortion compensation coefficient being stored in a designated readout address;
   a predistortion section performing distortion compensation processing onto a transmission signal, using the distortion compensation coefficient being output from said memory; and
   a distortion compensation section calculating an update value of the distortion compensation coefficient, based on the error component existent between the transmission signal before said distortion compensation processing and the transmission signal after being amplified by an amplifier,
   wherein said distortion compensation section further comprises a function of controlling to modify a degree of effect of the error component produced on the update value, when calculating the update value of the distortion compensation coefficient
   wherein the modification of the degree of effect is realized by modifying the magnitude of the parameter to be multiplied by the error component, and
   wherein the distortion compensation apparatus comprises:
   a fast Fourier transform circuit performing fast Fourier transform of the transmission signal after being amplified by the amplifier; and
   a control means setting an optimal parameter value based on the output of the fast Fourier transform circuit,
   wherein, when the magnitude of the parameter is expressed by $1/2^n$, said control means varies said n value by the step of ±1 in the direction of decreasing the power amount of the noise floor which is produced in the output of the fast Fourier transform circuit after the distortion compensation coefficient is updated.

4. The distortion compensation apparatus according to claim 3,
   wherein, when the power amount of the noise floor is not varied, the control means selects a smaller value out of the parameter values.

5. The distortion compensation apparatus according to any one of claims 1 to 4,
   wherein, at the time of the start of transmission, or the occurrence of a fluctuation not smaller than a predetermined magnitude in the transmission output, the control means sets the step size parameter value to a predetermined magnitude until a certain time elapses from the time of the start of the transmission or the occurrence of the fluctuation, and after a lapse of the certain time, the control means controls to make the step size parameter value to a smaller value than the predetermined magnitude.

6. A method of distortion compensation for a distortion compensation apparatus comprising:

storing a distortion compensation coefficient in a designated write address of a memory in advance;

outputting a distortion compensation coefficient being stored in a designated readout address from the memory;

performing distortion compensation processing in a pre-distortion section, onto a transmission signal, using the distortion compensation coefficient being output from said memory;

calculating by a distortion compensation section, an update value of the distortion compensation coefficient, based on the error component existent between the transmission signal before said distortion compensation processing and the transmission signal after being amplified by an amplifier;

controlling to modify a degree of effect of the error component produced on the update value, by modifying the magnitude of the parameter to be multiplied by the error component, when calculating the update value of the distortion compensation coefficient;

further, by the distortion compensation section, storing a parameter in advance, corresponding to the integral value of the transmission signal before the distortion compensation processing or the transmission signal after being amplified by the amplifier;

generating an integral value of the transmission signal before the distortion compensation processing or the transmission signal after being amplified by the amplifier; and reading out the parameter corresponding to the output of the integral value; and setting the parameter corresponding to the integral value to a smaller value as the integral value becomes larger.

7. The method of distortion compensation according to claim 6,

Wherein when the integral value is not larger than a predetermined value, the parameter value is set to zero.

* * * * *